United States Patent [19]
Heller

[11] 4,388,383
[45] Jun. 14, 1983

[54] DEVICES HAVING CHEMICALLY MODIFIED P-TYPE INP SURFACES

[75] Inventor: Adam Heller, Bridgewater, N.J.

[73] Assignee: Bell Telephone Laboratories, Incorporated, Murray Hill, N.J.

[21] Appl. No.: 263,683

[22] Filed: May 14, 1981

[51] Int. Cl.³ .................... H01M 6/36; H01L 31/06
[52] U.S. Cl. .................... 429/111; 136/255; 136/262; 148/33.3; 204/290 R; 357/15; 357/30
[58] Field of Search ............... 429/111; 136/255, 262; 357/15, 30; 204/290 R; 148/33.3

[56] References Cited

U.S. PATENT DOCUMENTS 4,273,594  6/1981  Heller et al. .................... 148/33.3
4,310,405  1/1982  Heller .......................... 204/252
4,343,870  8/1982  Heller et al. .................... 429/111

OTHER PUBLICATIONS

P. Bindra et al., "Electrolytic Deposition of Thin Metal Films on Semiconductor Substrates", *J. Electrochem. Soc.*, vol. 124, pp. 1012-1018 (1977).
W. D. Johnston, Jr., et al., "Effect of Ruthenium Ions on Grain Boundaries In GaAs Thin Film Photovoltaic Devices", *J. Electrochem. Soc.*, vol. 127, pp. 90-95 (1980).
A. Heller et al., "11.5% Solar Conversion Efficiency in the Photocathodically Protected p-InP/V$^{3+}$-V$^{2+}$-HCl/C Semiconductor Liquid Junction Cell", *Appl. Phys. Lett.*, vol. 38, pp. 282-284 (1981).
B. A. Parkinson et al., "Enhanced Photoelectrochemical Solar Energy Conversion by GaAs Surface Modification", *Appl. Phys. Lett.*, vol. 33, pp. 521-523 (1978).
Y. Nakato et al., "The Catalytic Effect of Electrodeposited Metals on the Photo-Reduction of H$_2$O at p-Type Semiconductors", *Ber. Buns. Gesell fur Physik Chem.*, vol. 80, pp. 1289-1293 (1976).
H. Yoneyama et al., "Extension of Spectral Response of p-Type GaP Electrodes by Metal Adatoms", *J. Electrochem. Soc.*, vol. 125, pp. 68-74 (1978).
H. Uchida et al., "Surface States Formation Due to Impregnated Hydrogen at P-Type GaP Electrodes with Metal Adatoms", *J. Electrochem. Soc.*, vol. 127, pp. 99-104 (1980).

*Primary Examiner*—Aaron Weisstuch
*Attorney, Agent, or Firm*—Richard D. Laumann

[57] ABSTRACT

Semiconductor devices comprising p-type phosphorus containing semiconductor materials chosen from InP, GaP and InGaAsP have chemically treated surfaces comprising a monolayer or less of a metal chosen from silver, ruthenium, gold, platinum, and rhodium. Photoelectrochemical electrodes and Schottky barrier photovoltaic cells made from such treated semiconductors have reduced surface or grain boundary carrier recombination.

9 Claims, 3 Drawing Figures

DEVICES HAVING CHEMICALLY MODIFIED P-TYPE INP SURFACES

TECHNICAL FIELD

This invention is concerned generally with devices having chemically treated indium phosphide surfaces.

BACKGROUND OF THE INVENTION

In many types of minority carrier semiconductor devices, for example, photodetectors, solar cells, light emitting diodes and laser diodes, device performance may be limited by the surface recombination of carriers. The surface recombination of carriers is generally undesirable and may limit device efficiency for at least two reasons. First, the efficiency of minority carrier devices is reduced because carriers are lost in the recombination process and are, therefore, not collected. Second, surface recombination inevitably leads to some heating of the semiconductor surface, and as the device temperature rises, the device is more likely to fail.

Several techniques have been used to reduce surface recombination of carriers and surface state density. For example, a lattice matched heterojunction formed by growing a layer of $Ga_{1-x}Al_xAs$ on the air-exposed surface of GaAs reduces the recombination velocity and thus the surface recombination of carriers. The surface state density may be altered by well-known surface treatments such as the growth of native oxides or the deposition of $SiO_2$ or silicon nitride. However, altering of surface state density does not always affect surface recombination of carriers.

Surface treatment of a semiconductor in several GaAs devices has been shown to greatly improve device efficiency. Chemical treatment of the GaAs electrode in a semiconductor-liquid junction solar cell has been shown to increase device efficiency. In *Applied Physics Letters*, 33, pp. 521–523, Sept. 15, 1978, an efficiency of approximately 12 percent for a semiconductor-liquid junction solar cell having a chemically treated electrode surface was reported. An efficiency of less than 9 percent was obtained for a similar GaAs cell without a chemically treated electrode surface. The particular device described had a fraction of a monolayer of ruthenium on the GaAs electrode surface that contacted an aqueous selenide-polyselenide solution. It was hypothesized in the article that the ruthenium on the GaAs electrode surface altered the surface states initially within the GaAs bandgap in such a way that surface recombination was reduced and device efficiency increased.

A similar effect has been observed with devices using polycrystalline films. For example, *Journal of the Electrochemical Society*, 127, pp. 90–95, January 1980, described chemically treated polycrystalline gallium arsenide which produced large increases in the efficiency of solar cells upon chemical treatment with acid ruthenium (III) and/or basic lead (II) solutions.

Recently, relatively efficient p-type semiconductor-liquid junction solar cells have been reported. For example, *Applied Physics Letters*, 38, pp. 282–284, Feb. 15, 1981, reported a semiconductor-liquid junction solar cell using a p-type InP electrode and a $V^{3+}/V^{2+}$ redox couple in the electrolyte. Cells of this type have achieved a solar to electrical energy conversion efficiency of 11.5 percent. In this cell, $V^{3+}$ is reduced to $V^{2+}$ at the p-type surface by the photogenerated electrons. $V^{2+}$ is oxidized to $V^{3+}$ at the counterelectrode by holes. The recombination of electrons and holes at the InP-electrolyte interface is reduced, if not totally prevented, by a thin oxide layer which is formed in situ. The oxide, which is possibly of only monolayer thickness, is strongly bound. It was hypothesized in the article that the strength of chemical bonds at surfaces and grain boundaries is inversely correlated with recombination velocities, and such strong bonding therefore implies reduced carrier recombination.

Although results produced by the in situ oxidation are adequate for many purposes, other methods of treating the surface and improving device characteristics would be desirable. Other methods would be particularly desirable for polycrystalline semiconductor films in which grain boundaries may be insulated from each other upon oxidation.

SUMMARY OF THE INVENTION

I have found that a semiconductor device using a p-type phosphorous containing semiconductor, which has a surface that has been chemically modified, has improved characteristics. The surface contains a noble metal selected from the group consisting of silver, ruthenium, gold, platinum and rhodium in an amount less than a monolayer. In a preferred embodiment, the semiconductor is InP and the metal is Ag and is conveniently put on the surface in the desired amount by a chemical adsorption process. Devices in which this chemically modified surface results in improved device characteristics include Schottky barrier devices and semiconductor-liquid junction photocells.

Figure 1:
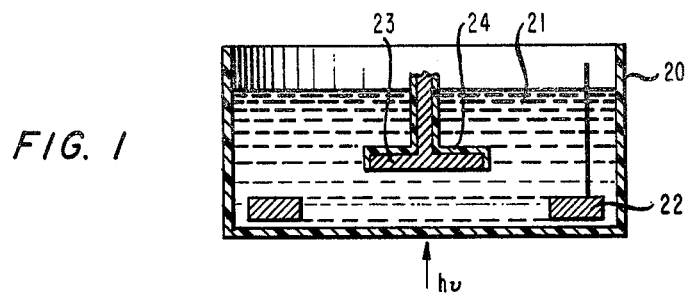
FIG. 1 is a cross-sectional view of one device, a semiconductor-liquid junction solar cell, of this invention.

For purposes of clarity, the elements of the devices are not drawn to scale.

DETAILED DESCRIPTION

Methods for preparing and chemically modifying a surface of the p-type phosphorous containing semiconductor, such as indium phosphide (InP), used in the semiconductor devices of this invention will be described first and then an exemplary InP semiconductor-liquid junction solar cell device and an exemplary InP Schottky junction device will be described in detail. It is to be understood that the invention is so described for purposes of illustration only and that the method of growing the indium phosphide, dopant and dopant concentration are not critical to this invention and that devices other than those specifically mentioned may also be constructed using chemically treated p-type InP surfaces. It also should be understood that the term surface as used in this application includes grain boundaries and that the invention may be used with polycrystalline as well as single crystal phosphorus containing semiconductors.

Materials which may be usefully applied to chemically treat the InP surface include silver, ruthenium, gold, platinum and rhodium. This means that the material used to chemically treat the surface must be at least as oxidizing as a solution of silver(I). The material is present in an amount less than one monolayer. Greater amounts may result in formation of a junction having different characteristics. It is to be understood that the material may not be present on the surface with perfect uniformity. The amounts are, thus, equivalent amounts. For purposes of illustration, this invention will be described by reference to silver.

Silver can be chemically adsorbed on the (100), (111)A and (111)B planes of single crystal InP as well as polycrystalline InP from either acid or basic silver solutions. In order to avoid deposition of excessively thick silver layers, a cyanide solution is preferred. The silver is strongly complexed in such a solution and the concentration of free silver ions is small. To chemically adsorb an appropriate amount, i.e., less than one monolayer, of silver, it is sufficient to dip the surface of the p-type InP in the silver containing cyanide solution for a period of approximately 1 to 20 seconds and then to rinse the InP surface in deionized water. The initial silver adsorption results from a reaction between the silver and the semiconductor atoms on or near the surface and is self-limiting. A solution of $KAg(CN)_2$ and KCN is preferred. A concentration of approximately 0.1 M for both compounds has been found to yield good results. Concentrations between $10^{-4}$ M and saturation may be used for $KAg(CN)_2$. Concentrations lower than $10^{-4}$ M are undesirable because of excessively slow adsorption rates. KCN is desirably present to assure that the silver is complexed. A 0.1 M to 0.5 M excess cyanide concentration is adequate to obtain this result. Other solutions may be used. For example, a dilute acid $AgNO_3$ solution or a dilute basic $Ag(NH_3)_2(NO_3)^-$ solution may be used. The other materials which may be used can be chemically adsorbed on the InP surface by similar and well-known methods which need not be described in detail.

The amount of silver adsorbed on the surface depends upon the crystal face. As shown by $Ag^{110}$ radiotracer measurements, approximately 5 to 10 percent of the indium, i.e., the (100) and (111)A, planes are covered by silver atoms while coverage of the phosphorus, i.e., (111)B plane, is approximately 20 percent. This coverage is generally insufficient to form a metal-semiconductor junction and no such junctions were observed.

It is hypothesized that the the chemical modification results from the reaction of the metal with phosphorus atoms at or near the semiconductor surface. This reaction removes states at or near the middle of the bandgap. Metals less oxidizing than silver will generally not react with the phosphorus atoms.

A higher density of surface silver atoms on the phosphorus plane suggests that silver is adsorbed preferentially by chemically bonding phosphorus atoms. These are likely sources for mid-gap states as are the As atoms in GaAs.

Silver is known to rapidly diffuse in solids and easily penetrates the grain boundaries in the approximately 10 micron films used, passivating the boundaries.

Other methods, such as electroplating, can be used to chemically treat the surface with silver or the other enumerated materials. However, the dipping procedure described has been found to allow easy control of the amount of material deposited while electrodeposition can easily result in deposition of material layers that are undesirably thick.

Single crystal and polycrystalline phosphorus containing semiconductors may be grown and doped by techniques well known to those working in the art. It was found that the p-type InP polycrystalline films may be conveniently prepared by chemical vapor deposition. In this method, indium is transported as InCl and $InCl_2$ in HCl and is reacted with phosphine on a graphite substrate on which p-type InGaAs had been first deposited to form an ohmic contact. The grains produced by this method were generally between 1 and 4 microns in size. The silver layer is then formed by dipping the polycrystalline surface in the silver solution.

The remaining device fabrication steps may now take place. For example, polycrystalline or single crystal p-type InP may be used in a semiconductor-liquid junction solar cell such as that depicted and described with respect to FIG. 1. A Schottky barrier device, such as depicted and described with respect to FIG. 2, may be fabricated by deposition of a metal layer, such as titanium, over the chemically treated polycrystalline or single crystal InP layer.

The semiconductor-liquid junction cell structure depicted in FIG. 1 comprises a container 20, liquid electrolyte 21, counterelectrode 22, and the photoactive electrode 23. The counterelectrode may be any inert material such as carbon. Electrode 23 comprises p-type InP having a chemically treated surface. Electrode 23 is covered with epoxy 24, except where illuminated, to insulate it from the electrolyte. A photovoltaic junction is formed at the interface between the chemically modified surface of electrode 23 and the electrolyte. The electrolyte is an aqueous solution and may further comprise a redox couple. The container may be made of any conveniently available glass or plastic material that is inert with respect to the electrolyte. One surface of the cell, enclosing electrode 23, is transparent so that incident light, indicated as hv, may pass through to electrode 23.

The redox couple, if present, is selected from the group consisting of $V^{2+}/V^{3+}$, $Nb^{4+}/Nb^{5+}$, and $Ti^{3+}/Ti^{4+}$ cations. The niobium couple is least desirable because it requires a highly concentrated acid solution. The redox couple concentration must be sufficient so that the cations are transported to the photoactive electrode in an amount sufficient to react with the flux of photogenerated electrons. In a preferred embodiment, the redox couple consists of $V^{2+}/V^{3+}$ cations.

Figure 2:
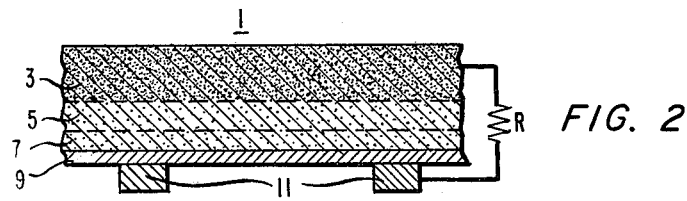
FIG. 2 is a cross-sectional view of another device, a Schottky barrier diode, of this invention.

The device depicted in FIG. 2 is a Schottky barrier device 1 which comprises a substrate 3, a buffer layer 5, a layer 7 of a phosphorus containing semiconductor, such as InP, having a chemcally modified surface and a metal layer 9 disposed on said chemically modified surface. Ohmic contact 11 is made to portions of layer 9 and another ohmic contact is made to the substrate. The ohmic contacts are made by well-known techniques. A load, in which useful work may be performed, is connected between the ohmic contacts. The substrate may comprise graphite, about 1 millimeter thick, and the metal may be titanium, about 100 Angstroms. The InP layer is generally between 10 and 20 microns thick.

Modifications of the device depicted in FIG. 2 are contemplated. For example, the buffer layer may be omitted. Additionally, ohmic contact 11 may cover the entire metal layer.

Figure 3:
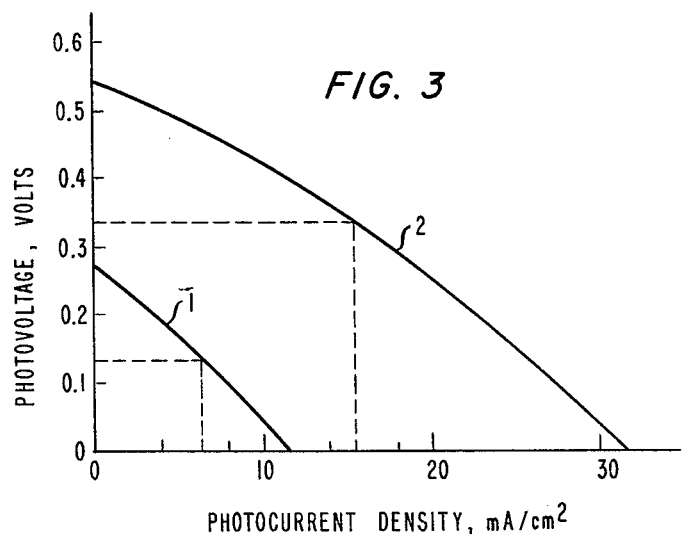
FIG. 3 plots the current-voltage characteristic of a polycrystalline, p-type InP semiconductor-liquid junction solar cell before and after chemisorption of silver.

FIG. 3 shows the current-voltage characteristics of a p-type InP semiconductor-liquid junction cell having a polycrystalline electrode before (curve 1) and after (curve 2) the electrode surface was chemically treated. The photovoltage is plotted vertically and the photocurrent horizontally. The maximum power points are indicated by the dotted lines. The redox couple consisted of $V^{3+}/V^{2+}$ cations. The total vanadium concentration in the solution was 0.3 M and the HCl was 1 M. The efficiency of the cell under tungsten halogen illumination was estimated as 7 percent. Some silver is slowly desorbed in the chloride solution and maintenance of the cell at its peak performance requires periodic electrode dipping into the silver cyanide solution previously described. Nevertheless, there is improved performance even if the electrode is not periodically dipped into a silver solution. It has been additionally observed that in addition to better reproducibility, silver offers the advantage of preventing reduction of the InP surface to indium metal and phosphide or to indium metal and phosphorus at strongly reducing potentials.

Schottky junction devices made as described with respect to FIG. 2, i.e., a graphite substrate and a polycrystalline InP layer, also had characteristics that varied greatly depending upon whether or not the InP had been chemically treated. Electron beam induced current collection studies showed a current amplification increase of approximately 1000 for the treated polycrystalline p-type InP.

The cell depicted in FIG. 1 may also be used to generate hydrogen. A photogenerated electron arriving at the interface between the chemically treated semiconductor electrode and the electrolyte can reduce protons to hydrogen. The thermodynamic potential for electrolysis of water is 1.23 volts. With a p-type InP photocathode and an $IrO_2$-$Ir(TaO_3)_4$-Ti anode, hydrogen and oxygen evolution begins in cells such as that depicted in FIG. 1 at 0.8 volts, without a redox couple, at typical solar intensities. The mechanism of hydrogen generation in acid involves adsorption of protons at the surface of the metal, reaction of these with electrons to produce adsorbed hydrogen atoms and recombination of the atoms to form hydrogen molecules which then desorb.

For hydrogen evolution, ruthenium, platinum and rhodium are preferred to silver. However, with rhodium and platinum a synergistic effect exists as silver further improves the performance of the hydrogen generating electrode.

While the photocathode reaction is invariably hydrogen generating, the reaction at the counterelectrode depends upon the anions in the solution. In perchloric acid, oxygen is produced on an $IrO_2$-$Ir(TaO_3)_4$-Ti anode. In hydrochloric acid, chlorine is produced on the same anode. The observed voltage threshold for the production of hydrogen and chlorine was 0.6 volts.

The stability of hydrogen generation at the maximum power savings point depends on the purity of the electrolyte and the material on the InP surface. It has been found that ruthenium shows the best stability. Upon passage of 7,500 Coulombs/$cm^2$ under tungsten-halogen light, the output at 0.25 volts versus the saturated calomel electrode drops by 30 percent. The full power output is, however, restored if the cell is allowed to reach its open circuit voltage. This is easily accomplished by opening the circuit for a brief time. It is believed that the restoration is due to an oxidation reaction which either restores some surface oxide, necessary to avoid carrier recombination, or strips an impurity adsorbed on the ruthenium islands.

The ruthenium, rhodium or platinum is conveniently formed on the surface of the InP by electroplating about 100 Angstroms and then etching off most of the metal. Suitable etchants, such as concentrated HCl, are well known to those working in the art. The metal islands remaining on the InP do not form a Schottky junction as is evident from the fact that the threshold potential for hydrogen generation, the equivalent of the open circuit voltage in a solar cell, remains the same with or without the noble metal islands.

Although described with respect to InP and Ag, it is to be understood that this invention may be used with any phosphorus containing semiconductor, e.g., GaP, $ZnSnP_2$ or InGaAsP, in which the noble metal chemically reacts with phosphorus atoms at or near the semiconductor surface to remove states at or near the middle of the bandgap.

What is claimed is:

1. A semiconductor device comprising a p-type semiconductor selected from the group consisting of InP and InGaAsP, said semiconductor having a chemically treated surface further containing a metal selected from the group consisting of silver, ruthenium, gold, platinum and rhodium, said metal being present in an amount less than 1 monolayer.

2. A device as recited in claim 1 in which said semiconductor is InP.

3. A device as recited in claim 2 in which said metal is silver.

4. A device as recited in claim 3 further comprising a counterelectrode and an electrolyte.

5. A device as recited in claim 4 in which said electrolyte further comprises a redox couple selected from the group consisting of $V^{3+}/V^{2+}$ and $Ti^{4+}/Ti^{3+}$.

6. A device as recited in claim 2 in which said metal is selected from the group consisting of platinum and rhodium.

7. A device as recited in claim 6 in which said surface further contains silver.

8. A semiconductor device comprising a p-type semiconductor selected from the group consisting of InP, GaP and InGaAsP, said semiconductor having a chemically treated surface further containing a metal selected from the group consisting of silver, ruthenium, gold, platinum and rhodium, said metal being present in an amount less than 1 monolayer, said device further comprising a metal layer forming a barrier with said treated semiconductor surface, said metal layer being disposed over said treated surface.

9. A device as recited in claim 8 in which said metal layer comprises titanium.

* * * * *